Sept. 24, 1968 R. C. HEUNER ET AL 3,403,266

CLOCK-PULSE STEERING GATE ARRANGEMENT FOR FLIP-FLOP EMPLOYING ISOLATED GATE CONTROLLED CHARGING CAPACITOR

Filed Nov. 17, 1966

INVENTORS:
ROBERT C. HEUNER &
JOSEPH W. HARMON
BY John V. Regan
Attorney

United States Patent Office 3,403,266

Patented Sept. 24, 1968

3,403,266
CLOCK-PULSE STEERING GATE ARRANGEMENT FOR FLIP-FLOP EMPLOYING ISOLATED GATE CONTROLLED CHARGING CAPACITOR

Robert C. Heuner, Bound Brook, and Joseph W. Harmon, Highland Park, N.J., assignors to Radio Corporation of America, a corporation of Delaware Filed Nov. 17, 1966, Ser. No. 595,247
13 Claims. (Cl. 307—247)

This invention relates to digital circuits, and in particular to steering arrangements which are readily adaptable for integrated circuit fabrication.

Steering arrangements are useful in conjunction with flip-flops (bistable multivibrator) to steer applied input signals to appropriate ones of the flip-flop input terminals, as in triggerable flip-flop, counter and shift register systems. The present invention is concerned with the race condition problem which can occur in most shift registers, some counter and some control flip-flop systems. The race condition is one in which the flip-flops of the system improperly switch and may be caused, inter alia, by such factors as clock skew, by differing flip-flop loading, and by inherent switching delays.

Steering arrangements which are suited for integrated circuit fabrication are described in co-pending U.S. Patent applications, Ser. No. 470,869 of William C. Blumenstein for Electrical Circuit, filed July 9, 1965, and Ser. No. 470,868 of Ying Luh Yao for Electrical Circuit, filed July 9, 1965, both assigned to the assignee of the present invention. The steering arrangements described in these applications employ first and second low valued capacitors (e.g. metal oxide or junction capacitors of which one plate is the substrate in an integrated circuit) in conjunction with first and second clock pulse steering transistors to achieve a capacitor multiplication effect. When the clock or control signal has a first amplitude value (absence of a clock pulse), the clock pulse steering transistors are nonconducting and binary input signals selectively disable the charging circuit of one of the capacitors while permitting the other capacitor to be charged. The disabling of the charging circuit is achieved by means of third and fourth signal level responsive transistors each having its collector-emitter path connected across one of the capacitors. Thus, the input signal levels selectively operate the third and fourth transistors in either ON or OFF conditions such that an ON transistor provides a low impedance current path across its associated capacitor. When the clock pulse changes to a second amplitude value (presence of a clock pulse), the one of the first and second transistors associated with a previously charged capacitor turns on to discharge the capacitor via its base-emitter junction. Collector current flows in that transistor to one of the flip-flop input terminals during the discharge period.

The above described steering arrangements are advantageous in many respects, however, their susceptibility to race conditions is dependent to some extent upon clock skew and/or differing flip-flop delays. The race condition may exist, for example, in a shift register wherein the delay of one flip-flop is rather long compared to the delay of the next preceding flip-flop. In such a case, while the one flip-flop is switching, the input signal level may change and turn on the one of the third and fourth transistors associated with the discharging capacitor, thereby providing an additional discharge circuit which could erroneously prevent switching of the flip-flop. The factor of differing delays is further compounded at higher extremes of the temperature and supply voltage range because transistor storage times have been observed to increase at different rates with increases in temperature and supply voltage. Thus, the probability of race conditions for the flip-flop results in a limited range within which the delays of different flip-flops must fall thereby decreasing yield in the integrated circuit fabrication process.

It is an object of the present invention to provide improved and novel steering arrangements.

Another object is to provide improved steering arrangements for flip-flop circuits which are substantially immune to the race condition.

In brief, the steering arrangements described in the aforementioned patent applications are improved in the embodiments of our invention by connecting the collector-emitter paths of first and second pairs of third and fourth transistors in series across the first and second capacitors, respectively. The conductive state of the third transistors in the first and second pairs is selectively controlled by first and second signal level gating means; while the conductive states of the fourth transistors of the first and second pairs is controlled by a control or clock signal responsive means. In the illustrated embodiment of the invention, each of the control signal responsive means includes a fifth transistor having its collector-emitter path connected between the control signal source and the base electrode of the associated fourth transistor. During the presence of a control or clock pulse, the collector-emitter paths of both of the fifth transistors are utilized to clamp the base electrodes of both of the fourth transistors to the clock signal voltage level whereby both of the fourth transistors are prevented from turning on until the clock pulse is terminated. Thus, when the clock pulse is present, the fourth transistor cannot be turned on and there can be no shunt discharge path for the associated capacitor irrespective of either of the third transistors being turned on in response to input signal level changes during this period. Consequently, the susceptibility of the steering arrangement of the present invention to race conditions is independent of clock skew and/or differing flip-flop delays since the shunt current path across the first and second capacitors is essentially isolated from changes in signal level conditions during the presence of a clock pulse.

In the accompanying drawing, like reference characters denote like components, and:

Figure 1:
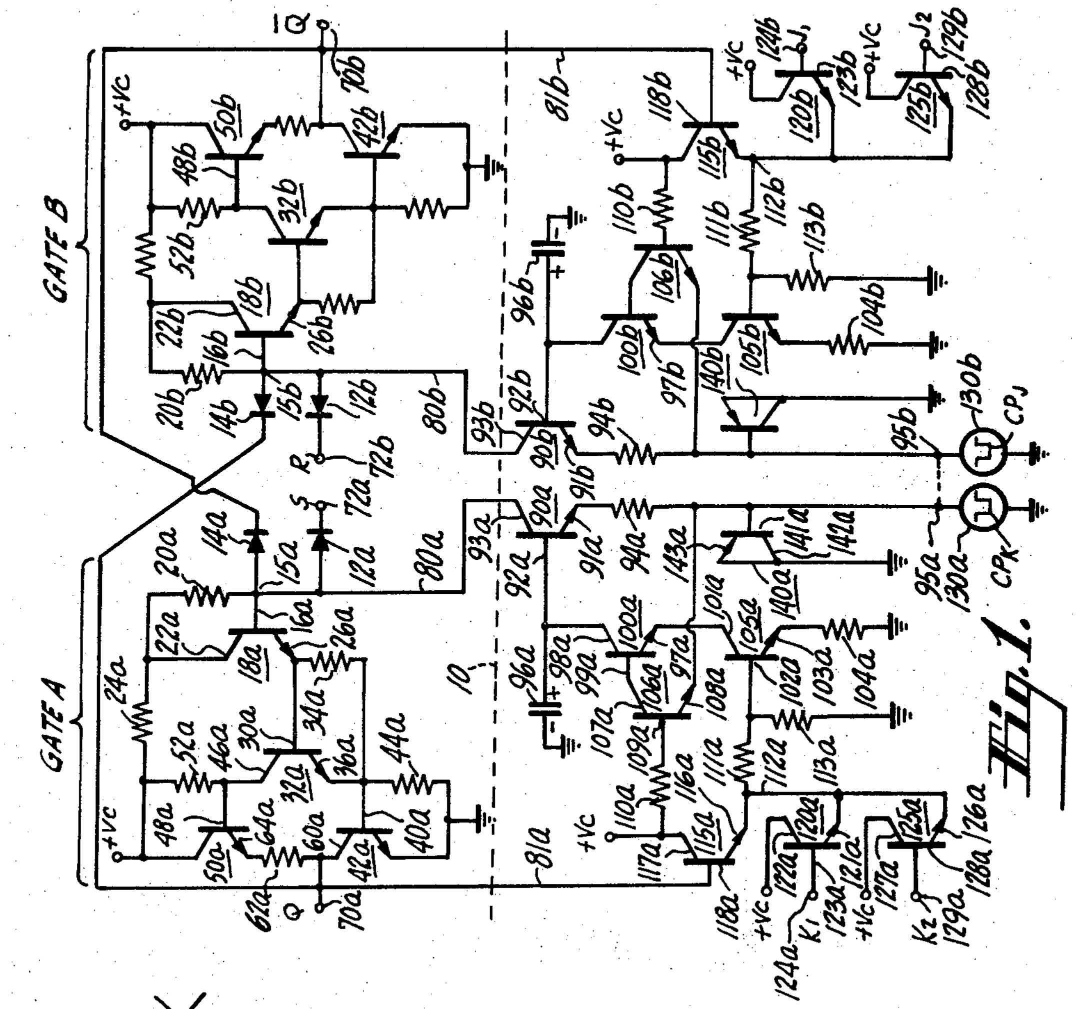
FIG. 1 is a schematic diagram of a flip-flop, and an improved steering arrangement embodying the invention.

The steering arrangement of the present invention is contemplated to provide the well known J–K flip-flop operation. Briefly, a J–K flip-flop is one which yields a predictable output for every possible combination of input signal levels. The J–K flip-flop exhibits the properties reflected in the following Truth Table wherein $J^n$ represents the value of the *n*th input signal level applied to the J terminal, $K^n$ represents the value of the *n*th input signal level applied to the K terminal, and $Q^{n+1}$ represents the state in which the flip-flop is placed as a result of the application of the $J^n+K^n$ input signal levels.

TRUTH TABLE

| $J^n$ | $K^n$ | $Q^{n+1}$ |
|---|---|---|
| 0 | 0 | [1] $\bar{Q}$ |
| 0 | 1 | 0 |
| 1 | 0 | 1 |
| 1 | 1 | [2] Q |

[1] Triggerable.
[2] No change.

For the purpose of the following description, the convention of positive logic is arbitrarily adopted wherein the binary "1" and "0" signal levels correspond to the most positive (HI) and most negative (LO) signal levels, respectively. With reference to the above Truth Table, if "1"

signal levels are applied to both the J and K input terminals, the flip-flop remains in its preexisting state, i.e., there is no change in the state of the flip-flop. If "0" signal levels are applied to both the J and K input terminals, the state of the flip-flop is reversed from the preexisting state, i.e., the flip-flop acts as a triggerable flip-flop. If "0" and "1" signal levels are applied to the J and K terminals, respectively, the Q output assumes a "0" level. Finally, if "1" and "0" signal levels are applied to the J and K input terminals, respectively, the Q output terminal of the flip-flop assumes a "1" signal level.

J–K flip-flop circuits according to our invention may be constructed either with discrete components or by means of conventional integrated circuit processes wherein the circuit components are formed in monolithic chips of semiconductor material. For example, according to conventional integrated circuit techniques, the circuit components of an entire J–K flip-flop can be formed, as by diffusion, in a monolithic chip of semiconductor material, such as silicon. These J–K flip-flop chips are useful as basic building blocks which may be interconnected and combined with appropriate power supplies and signal sources to form a variety of digital systems, such as counters, registers, memories, and the like.

The steering arrangements of this invention are not limited in their application to use with any one particular type of load. However, for the purpose of example in completeness of description, the FIG. 1 circuit includes a schematic diagram of one type of load with which the steering arrangement may be employed. The load is located above the dashed line 10 and comprises a pair of inverter gates A and B which are cross-coupled in the usual manner to form a flip-flop (bistable circuit). In essence, each of the illustrated inverter gates A and B includes an inverter portion comprised of transistors 18, 32, 42 and 50 and a gating portion comprised of diodes 12 and 14.

Specifically, gate A includes a plurality of input gating diodes **12*a*, 14*a* having their anodes connected together at an input junction 15*a* at the base electrode 16*a* of an NPN transistor 18*a* in the inverter portion of gate A. A resistor 20*a* is connected between the base electrode 16*a* and the collector electrode 22*a*, and a supply resistor 24*a* is connected between collector electrode 22*a* and a source of suitable operating potential, designated $+V_c$. Emitter electrode 26*a* is directly connected to the base electrode 30*a* of another NPN transistor 32*a*, and is connected by way of a resistor 34*a* to the emitter electrode 36*a* of the latter transistor and the base electrode 40*a* of still another NPN transistor 42*a*. A resistor 44*a* is connected between circuit ground and a point common to the base electrode 40*a* and the emitter electrode 36*a*. The collector electrode 46*a* of transistor 32*a* is connected to the base electrode 48*a* of an NPN transistor 50*a*, and is returned to the $+V_c$ source by way of a supply resistor 52*a*. Transistor 42*a* has its collector electrode 60*a* connected by way of a resistor 62*a* to the emitter electrode 64*a* of the transistor 50*a*, whereby the collector-emitter paths of these transistors are connected in series between circuit ground and the $+V_c$ volt source. A first output, designated Q, is derived at a terminal 70*a* which is connected at the collector electrode 60*a***. Gate B is identical to gate A, and like components are designated by like reference numerals followed by the letter *b*. For operation as a flip-flop, the Q output terminal **70*a* is connected to the cathode of the input diode 14*b* in gate B, and the $\overline{Q}$ output terminal 70*b* of gate B is connected to the cathode of the input diode 14*a*** in gate A.

In the operation of the flip-flop, the flip-flop may be switched to the SET state by applying an input signal of suitable value at the input terminal **72*a* to forward bias diode 12*a* and to render transistor 18*a* nonconducting. The voltage at the emitter electrode 26*a* thereof then has a value close to ground potential, whereby transistors 32*a* and 42*a* are rendered nonconducting. The voltage at collector electrode 46*a* of transistor 32*a* then rises in a positive direction to render transistor 50*a* conducting, whereby the Q output voltage at terminal 70*a* has its most positive or HI value. This HI voltage, when fed back to the cathode of input diode 14*b*, reverse biases this diode. Transistor 18*b*, in gate B, then is rendered conducting by base current flow supplied through the base bias resistor 20*b*. With transistor 18*b* conducting, the voltage at its emitter electrode 26*b* has a positive value, whereby transistors 32*b* and 42*b* are rendered conductive. Sufficient current flows through transistor 32*b* and its collector resistor 52*b* to lower the voltage at the base electrode 48*b* of transistor 50*b* and thereby decrease conduction in that transistor. With transistor 42*b* in a conducting state, the $\overline{Q}$ output voltage at terminal 70*b* has its most negative or LO value which is close to ground potential. This LO voltage, when fed back to the cathode of input diode 14*a*, maintains transistor 18*a*** in a cut-off condition.

The flip-flop may be switched to the RESET state, by external means, by lowering the voltage at input terminal **72*b* to a value sufficient to cut-off the transistor 18*b*. Alternatively, the flip-flop may be switched from the SET to the RESET state by diverting sufficient current from the base electrode 16*b* to turn off the transistor 18*b* of the inverter portion of gate B. That is to say, if a sufficient amount of the current normally supplied by way of resistor 20*b* is diverted away from the base electrode 16*b*, transistor 18*b* will turn off, the $\overline{Q}$ output at terminal 70*b* assumes the HI level, and this HI level $\overline{Q}$ output will reverse bias input diode 14*a* and allow transistor 18*a*** in gate A to turn on.

A steering arrangement which embodies improvements according to our invention is illustrated in FIG. 1 below the dashed line 10. The steering arrangement includes a pair of identical steering gate sections A and B which are coupled by way of connections **80*a* and 81*a* to gate A of the flip-flop and by way of connections 80*b* and 81*b*** to gate B of the flip-flop, respectively. The circuit components in steering section A are designated by a reference numeral followed by the letter *a*, while similar components in steering section B are designated by the same reference numeral followed by the letter *b*. For the sake of convenience, only steering section A of the steering arrangement will be described in detail.

The steering section A includes NPN transistor **90*a* having its emitter electrode 91*a* connected by way of an emitter resistor 94*a* to a control or clock input terminal 95*a*. The collector electrode 93*a* is connected by way of connection 80*a* to the input point 15*a* of the flip-flop. Essentially, the resistors 20*a* and 24*a* serve as the collector supply resistance for the transistor 90*a***.

A capacitor **96*a* has one of its plates directly connected to a point of reference potential indicated by the conventional symbol for circuit ground. The other plate thereof is connected to the base electrode 92*a* of the transistor 90*a*. The capacitor 96*a* as well as the capacitor 96*b*** may be a metal oxide or junction capacitor, the grounded plate of which may be the substrate in an integrated circuit.

A pair of NPN transistors **100*a* and 105*a* have their collector-emitter paths connected in series between the base electrode 92*a* of transistor 90*a* and circuit ground. To this end, collector electrode 98*a* of transistor 100*a* is connected to base electrode 92*a*. The emitter electrode 97*a* of transistor 100*a* and the collector electrode 101*a* of transistor 105*a* are connected together; while the emitter electrode 103*a* of transistor 105*a* is connected by way of emitter resistor 104*a* to circuit ground. The collector-emitter path of a control signal responsive NPN transistor 106*a* is connected between the base electrode 99*a* of transistor 100*a* and the clock input terminal 95*a*. To this end, collector electrode 107*a* and base electrode 99*a* are connected together and emitter electrode 108*a* and clock input terminal 95*a* are connected together. Control signal responsive transistor 106*a* has its base electrode 109*a*** connected by way of base resistor 110a to the source of operating potential, designated $+V_c$.

A resistor 113a is coupled between the ground reference and the base electrode 102a of transistor 105a. The base electrode 102a is further coupled by way of base resistor 111a to the output point 112a of a signal level gating means which includes a plurality of NPN transistors 115a, 120a and 125a. The transistors 115a, 120a and 125a have their emitter electrodes 116a, 121a and 126a connected in common to the output point 112a. The collector electrodes 117a, 122a and 127a are each connected to the $+V_c$ source of operating potential. The base electrode 118a of transistor 115a is connected by way of connection 81a to the Q output terminal 70a of the flip-flop. An input terminal 124a, designated $K_1$, is coupled to the base electrode 123a of transistor 120a, Another input terminal 129a, designated $K_2$, is coupled to the base electrode 128a of transistor 125a. Similarly, in section B of the steering arrangement an input terminal 124b, designated $J_1$, is coupled to base electrode 123b of transistor 120b. An input terminal 129b, designated $J_2$, is coupled to base electrode 128b of transistor 125b. Further in section B, base electrode 118b of transistor 115b is connected by connection 81b to the $\overline{Q}$ output terminal 70b of the flip-flop.

The control or clock terminals 95a and 95b are connected, respectively, to first terminals of control or clock signal sources 130a and 130b, the other terminals of which are connected to circuit ground. The control signal sources 130a and 130b may be any suitable sources capable of generating bi-valued signals of the type designated $CP_k$ and $CP_j$ having either a high (HI) or a low (LO) level. For many applications, such as shift register systems, only one control or clock pulse source is necessary; and both control terminals 95a and 95b may be connected together as illustrated by the dashed line connection with only one of the sources, e.g., source 130a, being utilized .

In the operation of the J–K flip-flop circuit of FIG. 1, the steering arrangement functions in response to the control or clock signals $CP_k$ and $CP_j$ to steer the Q, $\overline{Q}$, $J_1$, $J_2$, $K_1$ and $K_2$ signal levels to appropriate input points 15a or 15b of the flip-flop. In particular while the clock signals are at the HI level, the steering arrangement receives information in the form of combinations of the aforementioned signal levels and stores the received information by means of the capacitors 96a and 96b. When the clock signal changes from the HI to the LO levels, the stored information is transferred to the flip-flop. Essentially, this type of operation simulates a "dual rank" or "master slave" type of operation..

Consider now the condition where both sections A and B of the steering arrangement are connected via the dashed line or control input terminal 95a such that only control or clock signal $CP_k$ is utilized. Consider also that the flip-flop is in the state wherein the Q output terminal 70a is at a "0" signal level and that the $\overline{Q}$ output terminal is at a "1" signal level. This state of the flip-flop corresponds to conduction of transistor 18b and nonconduction of transistor 18b in the gates A and B, respectively. Thus, transistor 42a is conducting and the Q output terminal 70a is at the "0" or LO level; while the transistor 50b is conducting and the $\overline{Q}$ output terminal 70b is at the "1" or HI level.

While the clock signal $CP_k$ is at the HI level, the steering arrangement sections A and B are conditioned to receive information. Referring first to section A, the transistors 115a, 120a and 125a form an OR gate for positive logic whereby a HI signal level applied to any one or more of the transistor base electrodes results in a HI signal level at the output point 112a. For the present, assume further that the $K_1$ and $K_2$ inputs are at the "0" or LO signal level such that all of the inputs Q, $K_1$ and $K_2$ to the gating transistors 115a, 120a and 125a are at the LO level. These LO level signal conditions are insufficiently positive to forward bias the base-emitter junctions of the transistors 115a, 120a and 125a or the base emitter junction of transistor 105a such that these transistors are turned off.

Transistor 90a and transistor 90b are turned off at this time due to the application of the HI level $CP_k$ signal to their respective emitter electrodes. With the HI level $CP_k$ signal also being applied o the emitter electrode of transistor 106a, the base 109a to emitter 108a junction is biased in a high forward impedance condition. The potential difference between the base electrode transistor 106a and the ungrounded plate of capacitor 96a is such that the base-collector junctions of transistors 106a and 100a become forward biased. Charging current then flows from supply $V_c$ through resistor 110a, the base-collector junctions of transistors 106a and 100a and capacitor 96a to circuit ground, thereby charging the ungrounded plate of capacitor 96a to a positive potential. Thus, for the condition where the Q, $K_1$ and $K_2$ signal levels are at the "0" or LO signal level, capacitor 96a is permitted to charge.

Referring now to section B of the steering arrangement, the HI level $\overline{Q}$ signal is translated with level shift via the base-emitter junction of transistor 115b to the output point 112b irrespective of the signal conditions of the $J_1$ and $J_2$ inputs. The HI level voltage at point 112b is sufficiently positive to provide via the base bias resistors 111b and 113b a forward bias for the base-emitter junction of transistor 105b. Thus, transistor 105b is turned on such that its collector-emitter path has a relatively small impedance, thereby clamping the emitter electrode 97b of transistor 100b to a relatively low voltage. With the HI level $CP_k$ signal being applied to the emitter electrode of transistor 106b, the base-emitter junction of this transistor is biased in a high forward impedance condition. With the emitter electrode 97b of transistor 100b at a relatively low voltage, the base-emitter junction of transistor 100b and the base-collector junction of transistor 106b are forward biased whereby current flows from supply $V_c$ through the resistor 110b, the base-collector junction of transistor 100b, the collector-emitter path of transistor 105b and resistor 104b to circuit ground. With both transistors 100b and 105b being turned on, their collector-emitter paths provide a shunt current path across capacitor 96b thereby preventing the charging of the capacitor such that the ungrounded plate of the capacitor is at a relatively low voltage. Thus, with the $\overline{Q}$ signal being at a HI level, and the $J_1$ and $J_2$ signals being at either the HI or LO level, the capacitor 96B is prevented from charging by the low impedance shunt circuit of the collector-emitter paths of transistors 100b and 105b. Consequently, during the HI level condition of the clock signal, input signal information is stored on the capacitors 96a and 96b.

When the clock signal $CP_k$ changes from the HI to the LO level, the information stored on the capacitors 96a and 96b is transferred to the flip-flop. Transistor 90b remains in the off condition since there is substantially no charge on the capacitor 96b. However, due to the positive charge on capacitor 96a, transistor 90a turns on. A current then flows, in the conventional sense, through the resistor 20a in gate A, the collector-emitter path of transistor 90a and emitter resistor 94a. Current is thereby diverted from the base electrode 16a of transistor 18a and causes this transistor to turn off, thereupon transistors 32a and 42a also turn off and transistor 50a (gate A) turns on, raising the Q output at terminal 70a from the "0" or LO level to the "1" or HI level. This HI signal level, when applied over the cross-coupling connection, reverse biases input diode 14b whereupon transistor 18b turns on and the $\overline{Q}$ output voltage falls from the HI to the LO signal level. Thus, the information stored on the capacitors 96a and 96b is transferred to the flip-flop when the control or clock signal changes from a HI to a LO value.

Capacitor 96a discharges when the transistor 90a is rendered conductive by the negative going clock signal $CP_k$. This capacitor is discharged by the base current in transistor 90a, and transistor 90a becomes nonconducting when the voltage across the capacitor is reduced to a sufficiently low value. The width or duration of signal applied to the flip-flop is determined by the time it takes to discharge capacitor 96a. In turn, this period is a function of the value of the capacitors, the value of the emitter resistor 94a and the beta of transistor 90a. Essentially, the transistor 90a multiplies the time constant by a factor equal to the beta of the transistor, because only a fraction of the emitter 91a current flows in the base 92a circuit to discharge the capacitor. It is this factor which allows the use of a capacitor 96a of small value (e.g., a metal oxide or junction capacitor in an integrated circuit), while still providing a sufficiently long time constant to assure complete switching of the flip-flop. The transistor 90a can be considered as being a capacitance multiplier.

While the clock signal $CP_k$ is at the LO level, it is possible that either of the $K_1$ or $K_2$ inputs could change from the LO to the HI signal level. This could be caused, for example, by different flip-flop delays in a shift register. If any of the $K_1$ and $K_2$ inputs changes from the LO to the HI signal level while the clock signal $CP_k$ is at a LO level, the transistor 105a would turn on. However, the LO level $CP_k$ signal is directly applied to the emitter electrode of transistor 106a whereby transistor 106a is turned on and effectively clamps the base electrode 99a of transistor 100a to the LO level $CP_k$ signal thereby preventing transistor 100a from turning on until the clock signal again changes to the HI level. Thus, there can be no shunt current path across capacitor 96a while the clock signal is at the LO level, thereby assuring that the discharging of capacitor 96a is solely by way of the base-emitter junction of transistor 90a to provide reliable switching of the flip-flop. In effect, this means that the $K_1$ and $K_2$ input signals can vary widely in time due to clock skew and different flip-flop delays and still not affect the proper triggering action of capacitor 96a.

When the clock pulse $CP_k$ returns to the HI level, the flip-flop is in the state where the Q and $\overline{Q}$ outputs are at the HI and LO levels, respectively. For the input signal conditions where inputs $J_1$ and $J_2$ are at the LO level and inputs $K_1$ and $K_2$ are at either of the HI and LO levels, the preceding description of operation for section A is applicable to section B and vice versa, such that capacitor 96b is charged and capacitor 96a is not charged. When the clock pulse again changes to the LO level, the flip-flop switches back to the state where the Q and $\overline{Q}$ outputs are LO and HI, respectively.

For the case where the Q and $\overline{Q}$ outputs are LO and HI, respectively, and any of the $K_1$ and $K_2$ inputs is HI, high voltage conditions exist at both points 112a and 112b whereby all of the transistors 105a, 105b, 100a and 100b are turned on and neither capacitor 96a nor 96b is charged. Similarly, neither of the capacitors is charged for the case where the Q and $\overline{Q}$ outputs are HI and LO, respectively, and any of the $J_1$ and $J_2$ inputs is HI. For these conditions, the negative going clock pulse $CP_k$ effects no change in the state of the flip-flop. Note that this discussion is also applicable to the case where at least one of both the J and K inputs is HI.

For the case where all of the $J_1$, $J_2$, $K_1$ and $K_2$ inputs are always LO, the complementary Q and $\overline{Q}$ outputs alternately charge capacitors 96a and 96b with successive HI valued clock levels. Thus, the J–K flip-flop switches from its preexisting state with each negative going clock pulse $CP_k$.

In some cases, there may be a ringing at the clock input terminal 95a, and the voltage thereat may become negative relative to the ground reference. This condition is to be avoided since otherwise both of the transistors 90a and 90b may conduct and produce false switching of the flip-flop. This condition is prevented by connecting a diode 140a between the control input terminal 95a and circuit ground, the diode being poled so as to become conducting when the voltage at the control input terminal 95a tends to fall negative relative to ground. The diode 140a may be a transistor of PNP conductivity having its base electrode 141a connected at the control input terminal 95a and having its collector electrode 142a and emitter electrode 143a connected together and to circuit ground.

The provision of separate emitter circuits and separate clock signal terminals 95a and 95b for transistors 90a and 90b, respectively, permits selective setting and resetting of the flip-flop under the control of the clock pulses. Thus in applications where both clock sources are utilized, the clock inputs can be employed to selectively transfer the information stored on either or both of the capacitors 96a and 96b to the flip-flop.

Figure 3:
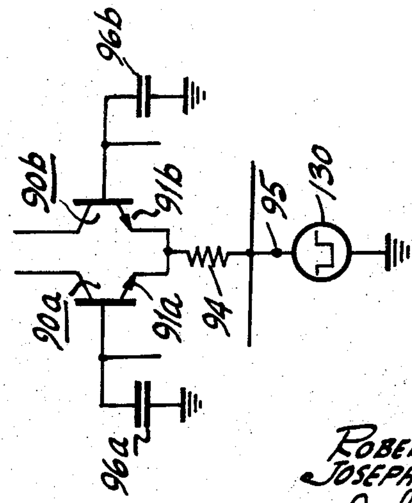
FIG. 3 is a schematic diagram of a portion of a steering arrangements exemplifying a further embodiment of the invention.

Referring now to FIG. 3, there is shown an alternative connection for the emitter circuits of transistors 90a and 90b wherein the emitter electrodes 91a and 91b share a common emitter resistor 94 connected to a single control or clock terminal 95. A single control or clock source 130 is then connected between control terminal 95 and circuit ground. The remainder of the steering arrangement is the same as the one illustrated in FIG. 1. It is evident that this circuit operates in the same manner as the FIG. 1 circuit when only one clock source is utilized.

Figure 2:
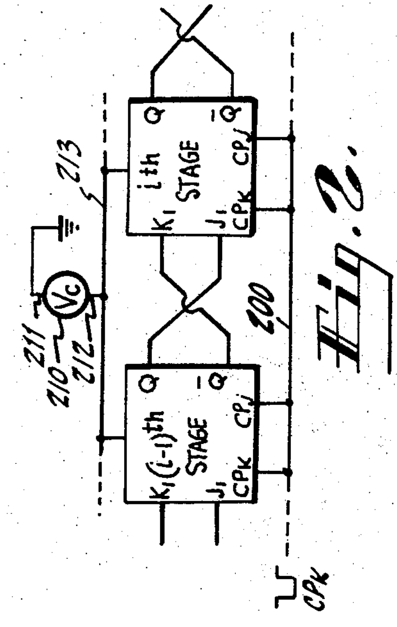
FIG. 2 is a block diagram of two intermediate stages of a shift register illustrating the interconnections between the flip-flops and steering arrangements.

The aforementioned feature of the invention which prevents either of the capacitors 96a and 96b from discharging via a path other than the base-emitter junction of the associated transistor 90a or 90b is instrumental in preventing race conditions in such digital systems as shift registers. There is shown in FIG. 2 an exemplary interconnection of J–K flip-flop building blocks to form a typical shift register. Each of the stages of the register is a J–K flip-flop circuit of the type disclosed in FIG. 1. For the sake of convenience, only the $i$th and $(i-1)$th stages of the register are illustrated. Essentially, all of the stages in the register are interconnected in the manner illustrated in FIG. 2 wherein the Q and $\overline{Q}$ output terminals of the $(i-1)$th stage (preceding stage) are connected to the $J_1$ and $K_1$ input terminals, respectively, of the $i$th stage (succeeding stage). For the shift function, only one clock pulse $CP_k$ is utilized so that the $CP_k$ and $CP_j$ terminals of all stages are connected to a common clock connection 200. In addition, a source of operating potential 210 is provided having a terminal 211 connected to the ground and a terminal 212 connected in common via a line 213 to the $V_c$ connections in each of the J–K flip-flops.

Consider that the J–K flip-flop in the $(i-1)$th stage has a faster switching time (shorter delay) than that of the $i$th stage. This might be caused, for example, by an increase in temperature or power supply voltage either of which has been observed to result in unequal rates of increase of transistor storage times. Thus, when the clock line $CP_k$ is at the LO level, the $(i-1)$th stage could switch before the $i$th stage causing the LO valued one of the $J_1$ and $K_1$ inputs to go HI before the capacitor 96a or 96b associated therewith has discharged sufficiently to effect a reliable switching of the $i$th stage. The J–K flip-flops of the present invention are immune to this condition since the base electrodes 99a and 99b of transistors 100a and 100b, respectively (FIG. 1), are effectively clamped to the LO valued $CP_k$ signal via the collector-emitter paths oft ransistors 106a and 106b, respectively. Thus, the $K_1$, $K_2$, $J_1$ and $J_2$ input signals can vary widely in time due to clock skew and differing flip-flop delays and still not affect the proper transfer of information from capacitors 96a and 96b to the flip-flop.

The shift register illustrated in FIG. 2 is only one example of a digital system constructed with J–K flip-flops. Other examples are described in a publication entitled, RCA Integrated Circuits Application Note, Features and Applications of RCA Low-Power DTL Integrated Circuits, published in November 1965.

Although the invention has been illustrated with all transistors being of the NPN conductivity type except for PNP transistors 140*a* and 140*b*, the invention is not limited thereto. For example, transistors 140*a* and 140*b* may be of the NPN type and all other transistors of the PNP type so long as the D.C. supply voltage, signal levels and clock signal levels are accordingly adjusted.

What is claimed is:

1. In a capacitance multiplication circuit in which capacitance means is coupled between a point of reference potential and the base electrode of a first transistor, the collector electrode of which is coupled to an output point and the emitter electrode of which is coupled to a control terminal means; the improvement comprising:
- second and third transistors having their collector-emitter paths connected in series across said capacitance means,
- a plurality of input terminals,
- gating means coupled between said input terminals and said second transistor, and
- control signal responsive means coupled between said control terminal means and said third transistor.

2. The invention according to claim 1
- wherein said third transistor has a base electrode, and
- wherein said control signal responsive means is a fourth transistor having a collector-emitter path connected between the base electrode of said third transistor and said control terminal means.

3. The invention according to claim 2
- wherein said second transistor has a base electrode,
- wherein said signal level gating means includes a plurality of fifth transistors each having base and emitter electrodes,
- wherein the base electrodes of said fifth transistors are connected to separate ones of said plurality of input terminals, and
- wherein the emitter electrodes of said fifth transistor are connected in common and to the base electrode of said second transistor.

4. The invention according to claim 3
- wherein each of said fifth transistors has a collector electrode; said fourth transistor has a base electrode, and
- wherein supply terminal means is connected in circuit with the collector electrodes of said first and fifth transistors and with the base electrode of said fourth transistor.

5. The invention according to claim 4
- wherein the emitter electrode of said first transistor is coupled to said control terminal means by way of first resistance means, and
- wherein the base electrode of said fourth transistor is coupled to said supply terminal means by way of second resistance means.

6. The combination comprising
- a flip-flop having first and second input points and first and second output terminals corresponding, respectively, to said first and second input points;
- control terminal means,
- a race preventing steering arrangement for said flip-flop having a first section associated with said first input point and a second section associated with said second input point, each said section including:
  - a capacitance multiplication circuit in which capacitance means is coupled between a point of reference potential and the base electrode of a first transistor, the collector electrode of which is coupled to the associated one of said flip-flop input points and the emitter electrode of which is coupled to said control terminal means,
  - second and third transistors having their collector-emitter paths connected in series across said capacitance means,
  - a plurality of input terminals, one of which is coupled to the associated one of said flip-flop output terminals,
  - gating means coupled between said input terminals and said second transistor, and
  - control signal responsive means coupled in circuit with said control input means and said third transistor.

7. The invention according to claim 6
- wherein said third transistor has a base electrode, and
- wherein said control signal responsive means is a fourth transistor having a collector-emitter path connected between the base electrode of said third transistor and said control terminal means.

8. The invention according to claim 7
- wherein said second transistor has a base electrode,
- wherein said signal level gating means includes a plurality of fifth transistors each having base and emitter electrodes,
- wherein the base electrodes of said fifth transistors are connected to separate ones of said plurality of input terminals, and
- wherein the emitter electrodes of said fifth transistors are connected in common and to the base electrode of said second transistor.

9. The invention according to claim 8
- wherein each of said fifth transistors has a collector electrode; said fourth transistor has a base electrode, and
- wherein supply terminal means is connected in circuit with the collector electrodes of said first and fifth transistors and with the base electrode of said fourth transistor.

10. The invention according to claim 9
- wherein the emitter electrodes of the first transistors of said first and second sections are coupled together and by way of first resistance means to said control terminal means, and
- wherein the base electrode of said fourth transistor is coupled to said supply terminal means by way of second resistance means.

11. The invention according to claim 9
- wherein power supply source means is connected to said supply terminal means,
- wherein control signal source means is connected to said control terminal means, and
- wherein input signal deriving means is coupled to said input terminals.

12. In a simulated dual rank flip-flop arrangement which includes a slave flip-flop having first and second input points and first and second output terminals corresponding respectively, to said first and second input points; first and second pluralities of input terminals; said first output terminal providing input signal levels to one of said first plurality of input terminals and said second output terminal providing input signal levels to one of said second plurality of input terminals; input signal level deriving means connected to the remainder of said input terminals; bi-level control signal source means having control terminal means; and a master storage configuration including first and second capacitance multiplication circuits in each of which capacitance means is coupled between a point of reference potential and the base electrode of a first transistor, the collector electrode of which is coupled to the associated one of the flip-flop inputs and the emitter electrode of which is coupled to said control terminal means, whereby a first of said control signal levels conditions said multiplication circuits to store information in accordance with said input signal levels and the second of said control signal levels effects a transfer of said stored information to said slave flip-flop; a race preventing steering arrangement comprising:
- first and second control signal responsive means for providing charging paths for the capacitance means of said first and second multiplication circuits, respectively, in response to said first control signal level, first and second input signal level responsive means associated with said first and second multiplication circuits, respectively, and coupled to said first and second plurality of input terminals, respectively, and responsive to said input signal levels to selectively provide shunt paths across said capacitance means thereby selectively preventing the charging of said capacitance means, the one of said first transistors associated with a charged capacitance means becoming conductive in response to said second control signal level to thereby provide a discharge path for said charged capacitance means and to effect a transfer of the stored information thereof to the associated one of said flip-flop input points, and said first and second control signal responsive means being further responsive to said second control signal level to provide a high impedance in each of said shunt paths to thereby prevent discharging of a charged one of said capacitance means via said shunt paths while said second control signal level is effecting a transfer of information to said slave flip-flop.

13. The invention according to claim 12 wherein each of said control signal responsive means includes second and third transistors arranged so that the base-collector junctions thereof are connected in an associated one of said charging paths and so that the collector-emitter path of said second transistor is connected between said control terminal means and the base electrode of said third transistor, wherein each of said input signal responsive means includes a fourth transistor arranged so that its collector-emitter path is in series with the collector-emitter path of the associated one of said third transistors to thereby provide an associated shunt path, and wherein each of said input signal responsive means further includes gating means responsive to the input signal levels applied to associated ones of said input terminals to selectively turn said fourth transistors on and off.

References Cited

UNITED STATES PATENTS 3,305,728 2/1967 Bailey ___________ 307—292 X

OTHER REFERENCES

Nerem Record, Nov. 4, 1965, pp. 176–177, by Transitron "High Level Transistor-Transistor Logic Flip-Flop," by Van Ligten et al.

JOHN S. HEYMAN, *Primary Examiner.*